United States Patent [19]
Fujihira et al.

[11] Patent Number: 5,576,655
[45] Date of Patent: *Nov. 19, 1996

[54] HIGH-WITHSTAND-VOLTAGE INTEGRATED CIRCUIT FOR DRIVING A POWER SEMICONDUCTOR DEVICE

[75] Inventors: Tatsuhiko Fujihira; Masaharu Nishiura, both of Nagano, Japan

[73] Assignee: Fuji Electric Co., Ltd., Tokyo, Japan

[*] Notice: The term of this patent shall not extend beyond the expiration date of Pat. No. 5,399,916.

[21] Appl. No.: 394,185

[22] Filed: Feb. 24, 1995

Related U.S. Application Data

[63] Continuation-in-part of Ser. No. 978,270, Nov. 18, 1992, Pat. No. 5,399,916.

[30] Foreign Application Priority Data

Nov. 29, 1991 [JP] Japan ................................ 3-315688

[51] Int. Cl.[6] ................................................ H03K 3/01
[52] U.S. Cl. .......................... 327/537; 327/535; 327/108
[58] Field of Search ..................................... 327/535, 537, 327/108, 427, 530, 538, 540, 541, 543; 361/91

[56] References Cited

U.S. PATENT DOCUMENTS

| | | | |
|---|---|---|---|
| 4,290,005 | 9/1981 | Arumughan | 307/296.6 |
| 5,043,605 | 8/1991 | Gabara | 307/296.6 |
| 5,084,637 | 1/1992 | Gregor | 307/475 |
| 5,095,226 | 3/1992 | Tani | 307/296.6 |
| 5,140,511 | 8/1992 | Lee et al. | 361/91 |
| 5,155,673 | 10/1992 | Takahasi et al. | 361/91 |
| 5,168,182 | 12/1992 | Salerno et al. | 361/91 |
| 5,179,494 | 1/1993 | Matsubara | 361/91 |
| 5,214,330 | 5/1993 | Okazaki | 307/475 |
| 5,227,680 | 7/1993 | Yee et al. | 307/475 |
| 5,289,425 | 2/1994 | Horiguchi et al. | 307/296.2 |

Primary Examiner—Timothy P. Callahan
Assistant Examiner—T. Lam
Attorney, Agent, or Firm—Brumbaugh, Graves, Donohue & Raymond

[57] ABSTRACT

In a high-withstand-voltage integrated circuit, several circuits are included at different potentials. Each circuit of a different potential has a power source, and interface circuits mediate signals between the circuits of different potentials. By this design, the required number of high-withstand-voltage elements is reduced, and a low-cost, high-withstand-voltage IC with high integration density, surge tolerance and stability is obtained.

13 Claims, 7 Drawing Sheets

5,576,655

HIGH-WITHSTAND-VOLTAGE INTEGRATED CIRCUIT FOR DRIVING A POWER SEMICONDUCTOR DEVICE

SPECIFICATION

This is a continuation-in-part application of U.S. patent application Ser. No. 07/978,270, filed Nov. 18, 1992, now U.S. Pat. No. 5,399,916.

BACKGROUND OF THE INVENTION

The present invention relates to a high-withstand-voltage integrated circuit having two or more power sources at different potentials. Such circuits have low loss and are suited for use under severe operating conditions with power-source voltage variations and surges as typically present in automotive electrical systems.

A conventional high-withstand-voltage integrated circuit (IC) in which a vertical power MOSFET, its control circuit and a protective circuit are integrated in one semiconductor substrate is described, e.g., by M. Glogolja et al., "Smart-SIPMOS—An Intelligent Power Switch", Conference Record, IEEE Ind. Appl. Soc. Annual Meeting, pp. 429–433 (1986). As illustrated by FIG. 2, such a high-withstand-voltage IC has five terminals, namely a main power-source terminal $V_{CC}$, a ground terminal GND, a power-output terminal $P_{OUT}$, a signal-input terminal $S_{IN}$, and a signal-output terminal $S_{OUT}$. The circuit is divided into a low-potential circuit L which is supplied with power from a low-potential power source VL, and a high-voltage circuit N which is connected to the main power source $V_{CC}$. The low-potential circuit L includes a digital-circuit section that inputs and outputs signals to and from external sources, and a logic circuit for control. The high-voltage circuit N includes an output-stage power switching element Q1, implemented by an n-channel power MOSFET, a drive circuit for the output-stage power element Q1, and an analog monitoring circuit for checking voltage, current, temperature, and feedback.

FIG. 3(a) and 3(b) represent cross-sectional portions of a typical IC-chip implementation of a conventional high-withstand voltage circuit.

Formed on an epitaxial n– layer 2 on an n+ substrate substrate 1 are a vertical power MOSFET 21, a p-channel MOSFET 22, an n-channel MOSFET 23, a Zener diode 24, a high-withstand-voltage p-channel MOSFET 25, and a high-withstand-voltage n-channel MOSFET 26. In the vertical MOSFET 21, a p-well 41 is formed selectively at the surface of the n– layer 2, an n+ source layer 51 is formed at the surface of the p-well, and a gate electrode 71 is between the exposed portions of the n+ source layer 51 and the n– layer 2, on a gate oxide film 6. A drain electrode 11 of MOSFET 21, on the back side of the substrate 11, is connected to the main (battery) power source $V_{CC}$, and a source electrode 12 is insulated by the gate electrode 71 and inter-layer insulation films 8 and makes contact with both the source layer 51 and the p-well 41.

In the p-channel MOSFET 22, a p-source layer 42 and a p-drain layer 43 are at the surface of the n– layer 2, a gate electrode 72 is on the gate oxide film 6 over the source and drain layers 42 and 43 which make contact with respective source and drain electrodes 13 and 14.

In the n-channel MOSFET 23, a p-well 44 is at the surface of the n– layer 2, an n+ source layer 52 and an n+ drain layer 53 are formed selectively at the surface of the n– layer 2, and a gate electrode 73 is on a gate oxide film 6 over the source and drain layers 52 and 53 which make contact with respective source and drain electrodes 15 and 16.

The Zener diode 24 is composed of a p-anode layer 45 formed at the surface of the p– layer 2, and an n-cathode layer 54 formed at the same surface. The anode and cathode layers 45 and 45 make contact with respective anode and cathode electrodes 17 and 18.

Similar to the p-channel MOSFET 22, the high-withstand-voltage p-channel MOSFET 25 has a p-source layer 46, a p-drain layer 47, a gate electrode 74, a source electrode 19, a drain electrode 20, and a gate oxide film 6. The MOSFET 25 also has a voltage-withstand structure including an extended portion of the gate electrode 74 in the channel section between the source layer 46 and the drain layer 47, and further including the drain electrode 20, the thick-oxide film 4 and the insulation film 8.

Similar to the n-channel MOSFET 23, the high-withstand-voltage n-channel MOSFET 26 has an n+ source layer 55, formed at the surface of a p-well 48. An n– drain layer 57 with a low impurity concentration surrounds an n+ drain layer 56, and a voltage-withstand structure is included, consisting of an extended portion of the gate electrode 75 between the channel portion and the drain electrode 30. The thick oxide film 4 and the insulation film 8 are formed as in the MOSFET 25. The source electrode 29 makes contact with both the n+ source layer 55 and the p-well 48. The drain electrode 30 makes contact with the n+ drain layer 56.

The conventional high-withstand voltage IC as described has several drawbacks. The active elements constituting the high-withstand-voltage circuit N are large-size elements such as, e.g., the high-withstand-voltage p-channel MOSFET 25 and the n-channel MOSFET 26 shown in FIG. 3(b). This results in increased chip area and cost. In the low-potential circuit L, the p-channel MOSFET 22, which must have high withstand voltage against the n– layer 2, requires the formation of a deep p-source layer 42 and a p-drain layer 43 by diffusion. This results in increased size and decreased integration density. When the main power-source voltage $V_{CC}$, applied to the drain electrode 11, varies due to voltage surges, the voltage in the source layer 42 of the p-channel MOSFET in the low-potential circuit L, the voltage in the drain layer 43, and the voltage in the n– layer 2 vary similarly. Moreover, a displacement current due to the junction capacitance and the voltage fluctuation may cause malfunctioning. For protection against over-currents and detection of loads, a comparator in the high-withstand-voltage circuit N is required to monitor the potential $P_{OUT}$ in the power output. Since $P_{OUT}$ generally varies from near the main power source $V_{CC}$ to GND, the comparator has low detection accuracy.

The present invention, described below, addresses the above-mentioned drawbacks and provides a low-cost, reliable high-withstand-voltage IC.

SUMMARY OF THE INVENTION

A preferred high-withstand-voltage integrated circuit comprises a low-potential power source, a high-potential power source, a low-potential circuit connected to the low-potential power source, a high-potential circuit connected to the high-potential power source, and interface-circuit means connected between the low-potential circuit and the high-potential circuit for mediating signals between the low-potential circuit and the high-potential circuit.

DETAILED DESCRIPTION OF PREFERRED EMBODIMENTS

Figure 1:
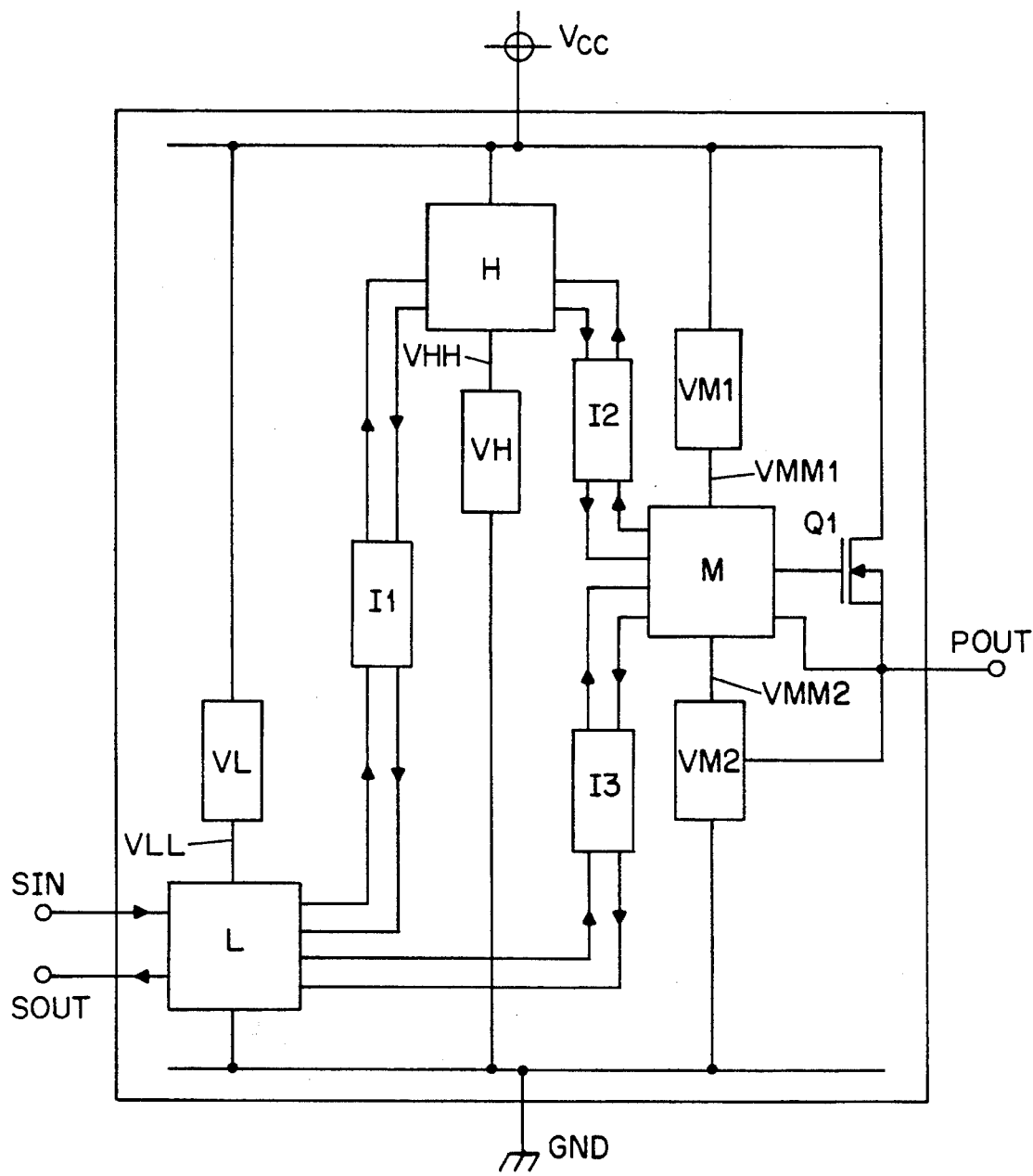
FIG. 1 is a circuit diagram of a high-withstand-voltage IC in accordance with a preferred embodiment of the invention.
Figure 2:
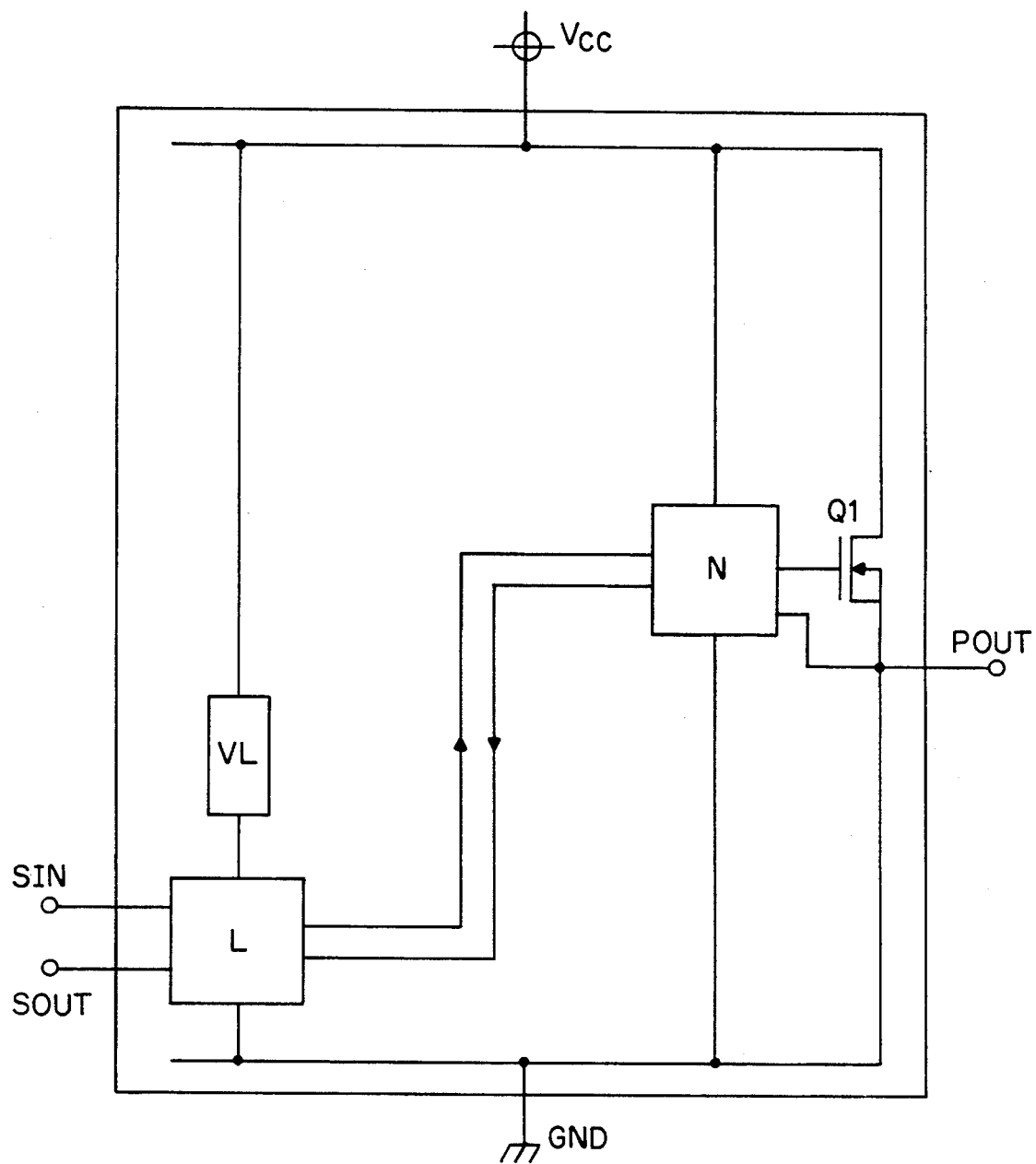
FIG. 2 is an circuit diagram of a conventional high-withstand-voltage IC.

One preferred high-withstand-voltage IC includes a low-potential power-source circuit, a high-potential power-source circuit, a low-potential circuit connected to the low-potential power source, and a high-potential circuit connected to the high-potential power source. In another embodiment, the IC further includes at least one intermediate-potential power source and at least one intermediate-potential circuit connected to the intermediate-potential power source.

In one embodiment of the invention, the high-potential power-source circuit includes a constant-voltage element, a load element, and a p-channel MOSFET. The high-potential sides of the constant-voltage element and the load element are connected to the high-potential line of a high-potential power-source line pair. The low-potential side of the constant-voltage element is connected to the high-potential side of the load element and the gate of the p-channel MOSFET. The low-potential side of the load element and the drain of the p-channel MOSFET are connected to a ground terminal. The source of the p-channel MOSFET is connected to the low-potential line of the high-potential power-source line pair.

In another embodiment of the invention, the high-potential power-source circuit includes a constant-voltage element, a load element, and a PNP transistor. The high-potential sides of the constant-voltage element and the load element are connected to the high-potential line of a high-potential power-source line pair. The low-potential side of the constant-voltage element is connected to the high-potential side of the load element and the base of the PNP transistor. The low-potential side of the load element and the collector of the PNP transistor are connected to a ground terminal. The emitter of the PNP transistor is connected to the low-potential line of the high-potential power-source line pair.

The constant-voltage element may be a Zener diode, and the load element a depletion-type MOSFET with the gate connected to the source. Alternatively, the load element may be a resistor. The high-potential line of the high-potential power-source line pair is connected to a main-power-source terminal.

The low-potential power-source circuit includes a constant-voltage element, a load element, and an n-channel MOSFET. The high-potential side of the load element and the drain of the n-channel MOSFET are connected to the main-power-source terminal. The high-potential side of the constant-voltage element and the low-potential side of the load element are connected to the gate of the n-channel MOSFET. The low-potential side of the constant-voltage element is connected to a ground terminal. The source of the n-channel MOSFET serves as the high-potential line of the low-potential power-source line pair.

The constant-voltage element of the low-potential power-source circuit may be a Zener diode, and the load element may be a depletion-type MOSFET with the gate connected to the source. Alternatively, the load element may be a resistor.

The IC may further include an intermediate-potential power-source and an intermediate-potential power-source circuit including a constant-voltage element, two load elements, a p-channel MOSFET, and an n-channel MOSFET. The high-potential side of the first load element and the drain of the n-channel MOSFET are connected to the main-power-source terminal. The low-potential side of the first load element is connected to the high-potential side of the load element and the gate of the n-channel MOSFET. The low-potential side of the constant-voltage element is connected to the high-potential side of the second load element and the gate of the p-channel MOSFET. The low-potential side of the second load element and the drain of the p-channel MOSFET are connected to a ground terminal. The source of the n-channel MOSFET is connected to the high-potential line of an intermediate-potential power-source line pair.

The low-potential side of the first load element in the intermediate-potential power-source circuit, the high-potential side of the constant-voltage element, and the gate in the n-channel MOSFET may be connected to power output terminals via rectifier elements. Beneficially vis-a-vis a conventional IC, a comparator may be formed at such a power output terminal, for reduced fluctuation range of the comparator input to the comparator potential, and thus for increased detection accuracy.

The constant-voltage element may be a Zener diode, and a load element may be a depletion-type MOSFET with the gate connected to the source. Alternatively, the load element may be a resistor. The rectifier element may be a diode.

A high-withstand-voltage IC may include several circuits at different potentials, each connected to its pair of power lines. Each of the circuits has an interface circuit for mediating signals between another circuit with different potential. An interface circuit includes two mediating circuits, each with a MOSFET, a load element, a constant-voltage element and a current-limiting element.

In one embodiment of the mediating circuit, the high-potential sides of the load element and the constant-voltage element are connected to the high-potential line of the power-source pair on the high-potential side. The low-potential sides of the load element and the constant-voltage element and the high-potential side of the current-limiting element are connected with each other and serve as signal-output nodes, to the circuit on the high-potential side. The low-potential side of the current-limiting element is connected to the drain of an n-channel MOSFET. The source of the MOSFET is connected to the low-potential line of the power-source line pair on the low-potential side. The gate of the n-channel MOSFET serves as a signal-input node, from the circuit on the low-potential side.

In another embodiment, the mediating circuit includes a p-channel MOSFET, a load element, a constant voltage element, and a current-limiting element. The low-potential sides of the load element and the constant-voltage element are connected to the low-potential lines of the power-source line pair on the low-potential side. The high-potential sides of the load element and the constant-voltage element, and the low-potential side of the current-limiting element are connected with each other and serve as signal-output nodes, to the circuit on the low-potential side. The high-potential side of the current-limiting element is connected to the drain of the p-channel MOSFET. The source of the p-channel MOSFET is connected to the high-potential line of the power-source-line pair on the high-potential side. The gate of the p-channel MOSFET serves as a signal-input node, from the circuit on the high-potential side. The constant-voltage element may be a Zener diode, the load element may be a depletion-type MOSFET with gate connected to source, and the current-limiting element may be a resistor.

Figure 4:
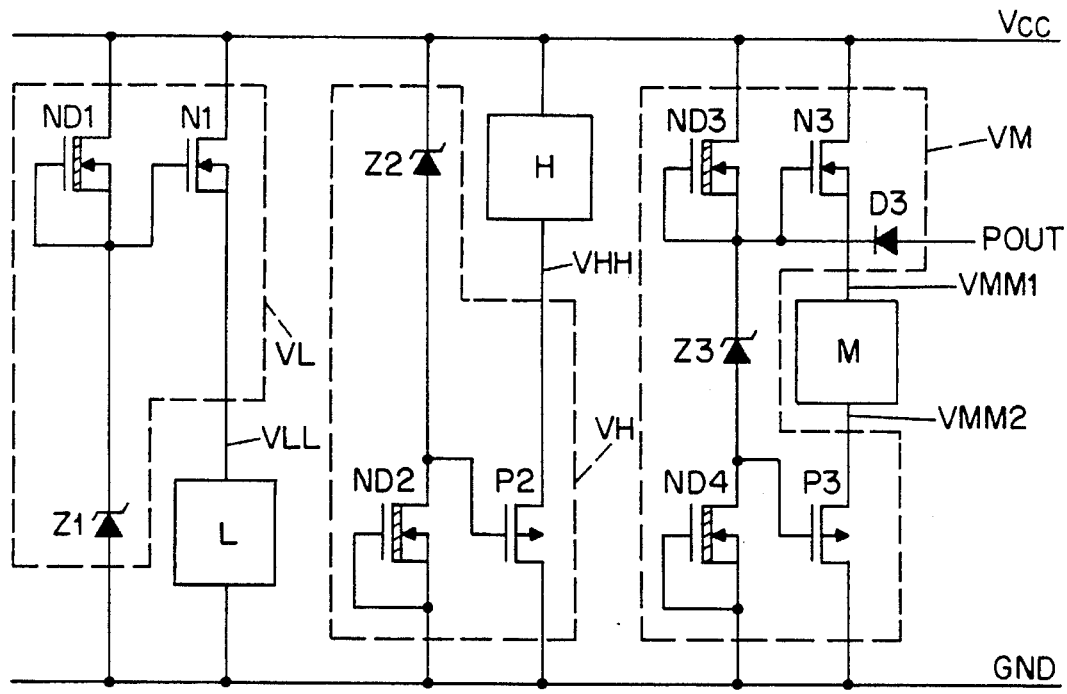
FIG. 4 is a circuit diagram of high-withstand voltage IC in accordance with a preferred further embodiment of the invention.

In the IC of FIG. 1, an input signal is fed from the terminal $S_{IN}$ into the low-potential circuit L which operates on the low-potential power source VL connected by the power-source line VLL. The low-potential power source VL is constructed as shown in FIG. 4, for example, with the high-potential side of the Zener diode Z1 as a constant-voltage element connected to the gate of an n-channel MOSFET N1 whose source is connected to the low-potential power-source line VLL and whose gate is connected to the low-potential side of the load element, namely a depletion-type MOSFET ND1 with gate connected to source. The low-potential side of the Zener diode Z1 and the low-potential side of the low-potential circuit L are connected to the terminal GND. While a resistor may be used as a load element, a depletion-type MOSFET is preferred because of its small size.

Figure 9:
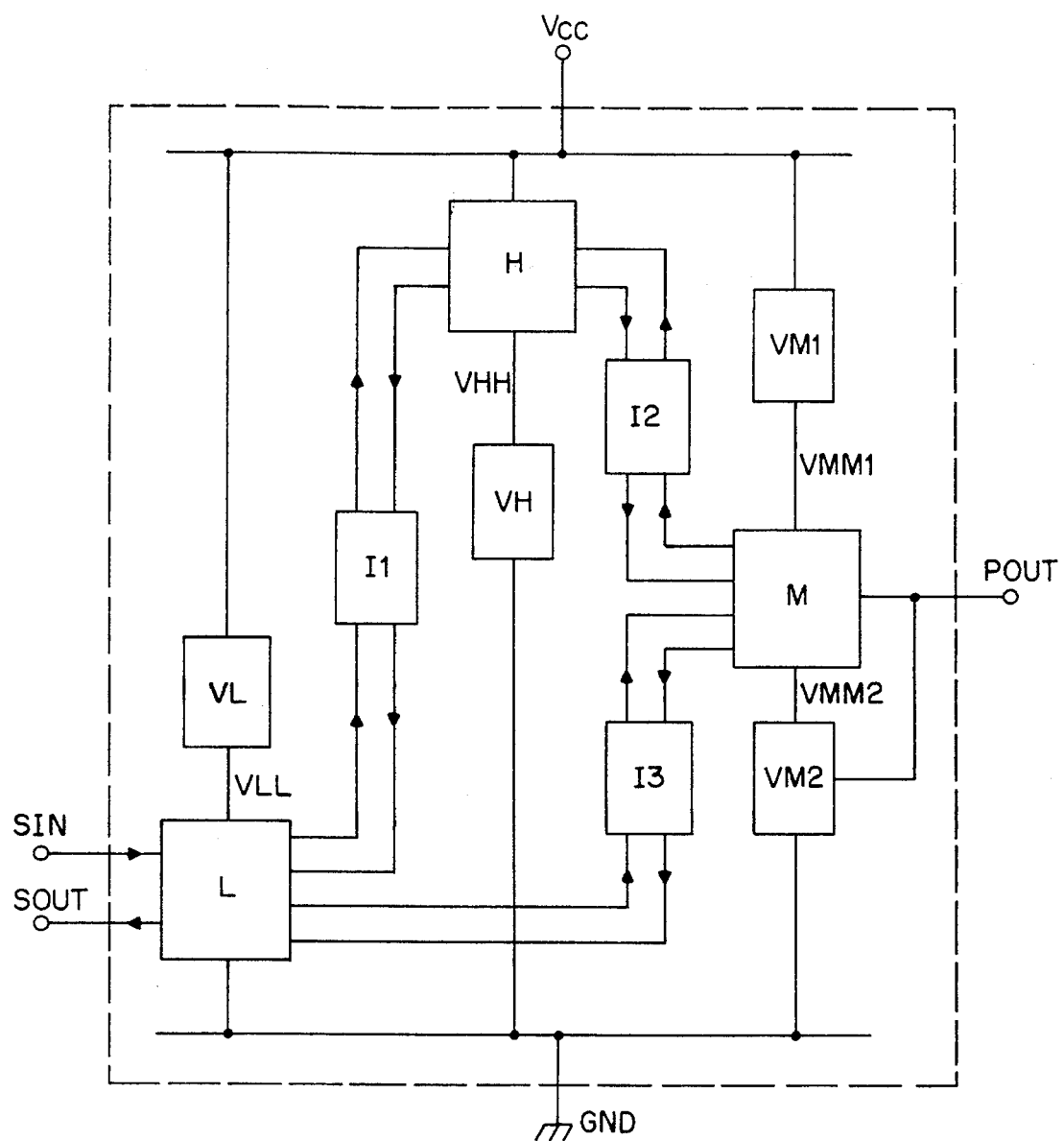
FIG. 9 is a circuit diagram of a high-withstand-voltage IC in accordance with a preferred further embodiment of the invention.

Signals from the low-potential circuit L are transmitted to the high-potential circuit H which is connected to the terminal $V_{CC}$ via the interface circuit I1 shown in FIG. 1, as well as to the intermediate-potential circuit M via the interface circuit I3. Circuit M is connected to the intermediate-potential power sources VM (VM1 and VM2), and to the terminal $P_{OUT}$. In one embodiment of the invention, as shown in FIG. 1, circuit M is connected to an output-stage power switching element Q1. In another embodiment of the invention, as shown in FIG. 9, no output-stage power switching element is included. Features shown in FIG. 9 are as described above for FIG. 1. Diodes connected in series in the forward direction, or series-connected MOSFETs with gate connected to drain can be used in place of Zener diodes as the constant-voltage elements.

An alternative IC in accordance with the invention does not include an intermediate-potential circuit, but only a high-potential circuit connected via an interface circuit to a low-potential circuit, and a single power source VH.

In FIG. 4, the high-voltage power source VH includes a Zener diode Z2, a p-channel MOSFET P2 and a depletion-type MOSFET ND2. The low-potential side of the Zener diode Z2 is connected to the gate of the p-channel MOSFET P2 and to the high-potential side of the depletion-type MOSFET ND2 with gate connected to source. The p-channel MOSFET P2 has its source connected to the low-potential power-source line VHH and its drain connected to the terminal $V_{CC}$. A PNP transistor may be used in place of the p-channel MOSFET P2.

In the described high-voltage power source VH, the current flowing through ND2 and Z2 generates a constant voltage across Z2, which is applied to the gate of the MOSFET P2 whose drain is connected to the terminal GND so as to maintain the potential constant against the P2 source and the high-potential power-source line of the high-potential power-source line pair. Thus, the line connected to the source of the MOSFET P2 can be made the low-potential power-source line VHH of the high-potential power-source line pair, and a high-potential power source VH can be formed.

The intermediate-potential power source VM of FIG. 4 has depletion-type MOSFETs ND3 and ND4 connected in series, with the Zener diode Z3 in between in series. The high-potential side of ND3 and the drain of the n-channel MOSFET N3 are connected to the terminal $V_{CC}$. The low-potential side of ND3 and the high-potential side of Z3 are connected to the gate of N3. The low-potential side of Z3 and the high-potential side of ND4 are connected to the gate of the p-channel MOSFET P3. The low-potential side of ND4 and the drain of P3 are connected to the ground terminal.

With these connections, a potential difference is generated across the Zener diode Z3, with the high-potential side of Z3 controlling the gate of the n-channel MOSFET N3, and the low-potential side controlling the gate of the p-channel MOSFET P3, thereby keeping the potential difference constant between the sources of N3 and P3. With the diode D3 connected between the terminal $P_{OUT}$ and the high-potential side of Z3, the potential in the high-potential side of Z3 follows the potential in the power output. VM is connected to the source of N3 as the high-potential line VMM1 and to the source of P3 as the low-potential line VMM2, of the intermediate-potential power-source-line pair.

If a comparator is included in VM, the fluctuation range of the comparator input to the comparator potential is reduced and the comparator detection accuracy is increased, as VM follows the potential in the power output. In FIG. 4, the terminal $P_{OUT}$ is connected via D3 to a common source-gate connection in ND3 and N3. Alternatively, connection may be via a diode to the drain of ND4 connected to the gate of P3. Also, a MOSFET with gate connected to drain can be used instead of a diode as a rectifier element.

Figure 5:
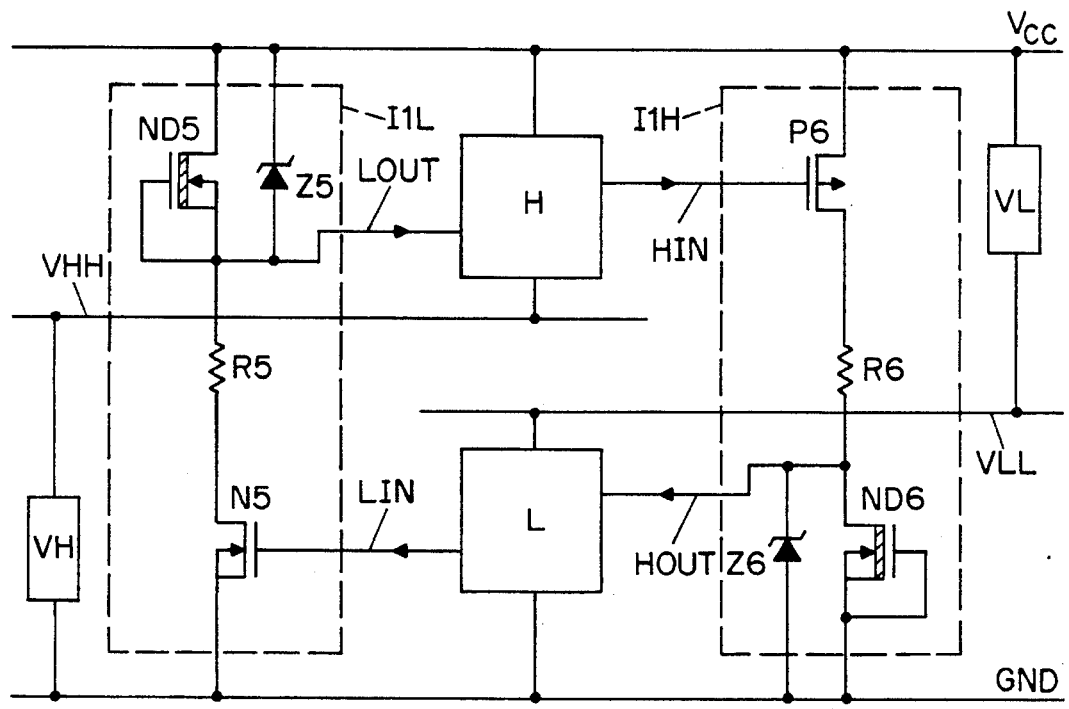
FIG. 5 is a circuit diagram of an interface circuit between the high-potential circuit and the low-potential circuit of a high-withstand-voltage IC in accordance with a preferred further embodiment of the invention.

FIG. 5 shows an interface circuit I1 between the high-potential circuit H and the low-potential circuit L, comprising two mediating circuits I1L and I1H. The mediating circuit I1L from L to H is connected as follows: the n-channel MOSFET N5 and the depletion-type MOSFET ND5 (with gate connected to source for load-element operation), are connected via a current-limiting resistor R5. A Zener diode Z5 is connected in parallel with ND5, so that the high-potential side of ND5 and the high-potential side of Z5 are connected to the high-potential line of the power-source line pair for the high-potential circuit H, and so that the low-potential sides of ND5 and Z5 and the high-potential side of R5 are connected to each other, thereby serving as nodes for signal output $L_{OUT}$ to H. The source of N5 is connected to the low-potential line of the power-source-line pair for the low-potential circuit L, and the gate of N5 serves as a node for signal input $L_{IN}$ from L.

The mediating circuit I1L operates as follows: If the gate of N5 is given a low signal $L_{IN}$ from the low-voltage circuit L, then N5 turns off. As a result, the potential on the low-potential side of Z5 becomes equal to the potential $V_{CC}$ of the high-potential power line of the high-potential power-source line pair, whereby a high signal $L_{OUT}$ is sent to H. If the gate of N5 is given a high signal $L_{IN}$, then N5 turns on, and a constant voltage lower than $V_{CC}$, determined by the Zener voltage of Z5, is generated on the low-potential side of Z5, whereby a low signal $L_{OUT}$ is sent to H. In this fashion, two circuits with different potentials are interfaced. The Zener voltage in the Zener diode Z5 must correspond to the Zener voltage in the Zener diode Z2 of the high-potential power source VH shown in FIG. 4.

The mediating circuit I1H from H to L is connected as follows: The p-channel MOSFET P6 is connected via a current-limiting resistor R6 with the load element ND6. The Zener diode Z6 is connected in parallel with ND6 such that the low-potential side of ND6 and Z6 are connected to the low-potential line of the power-source line pair for the low-potential circuit L (i.e., to the line to the terminal GND) and the high-potential sides of ND6 and Z6 and the low-potential side of R6 are connected to each other, thereby serving as a node to the signal output $H_{OUT}$ to L. The source of P6 is connected to the high-potential line of the power-source-line pair for H, and the gate of P6 serves as a node for the signal input $H_{IN}$ from H.

In the mediating circuit I1H, P6 turns on when the signal $H_{IN}$ is low, whereupon the signal $H_{OUT}$ assumes a voltage determined by the Zener voltage, whereby a high signal is fed to L. P6 turns off when the signal $H_{IN}$ is high, whereupon the signal $H_{OUT}$ turns low (to GND). The characteristics of Z6 must correspond to those of Z1.

Figure 6:
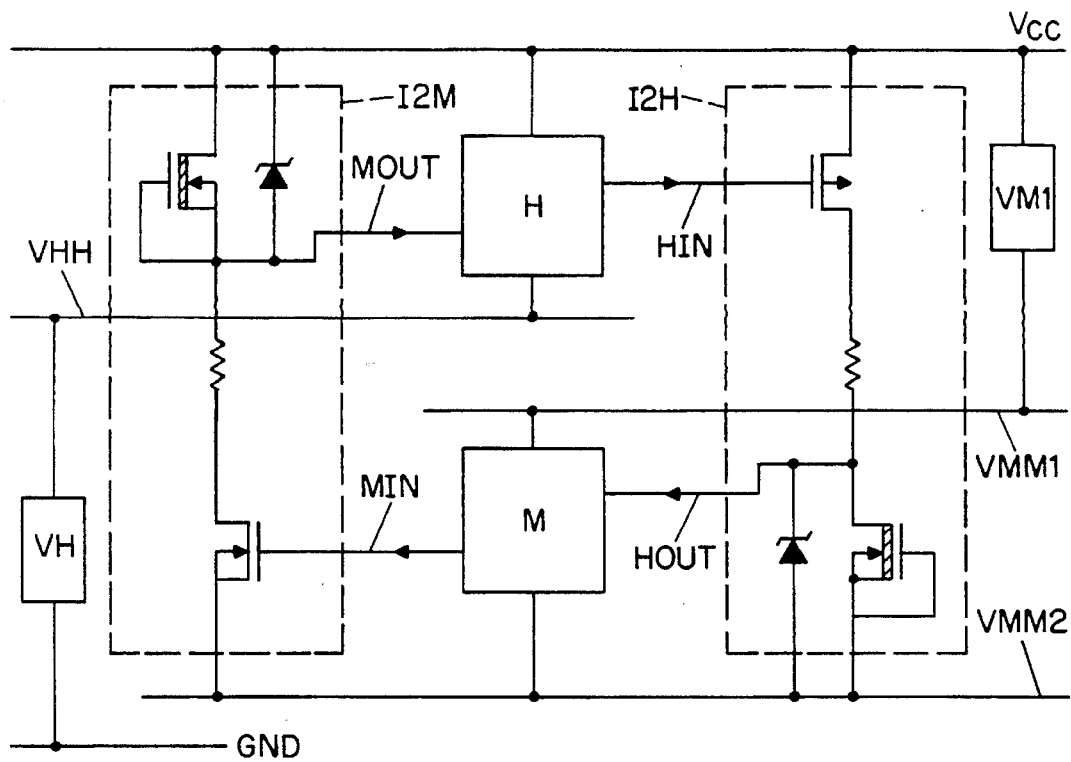
FIG. 6 is a circuit diagram of an interface circuit between the high-potential circuit and an intermediate-potential circuit of a high-withstand-voltage IC in accordance with a preferred further embodiment of the invention.
Figure 7:
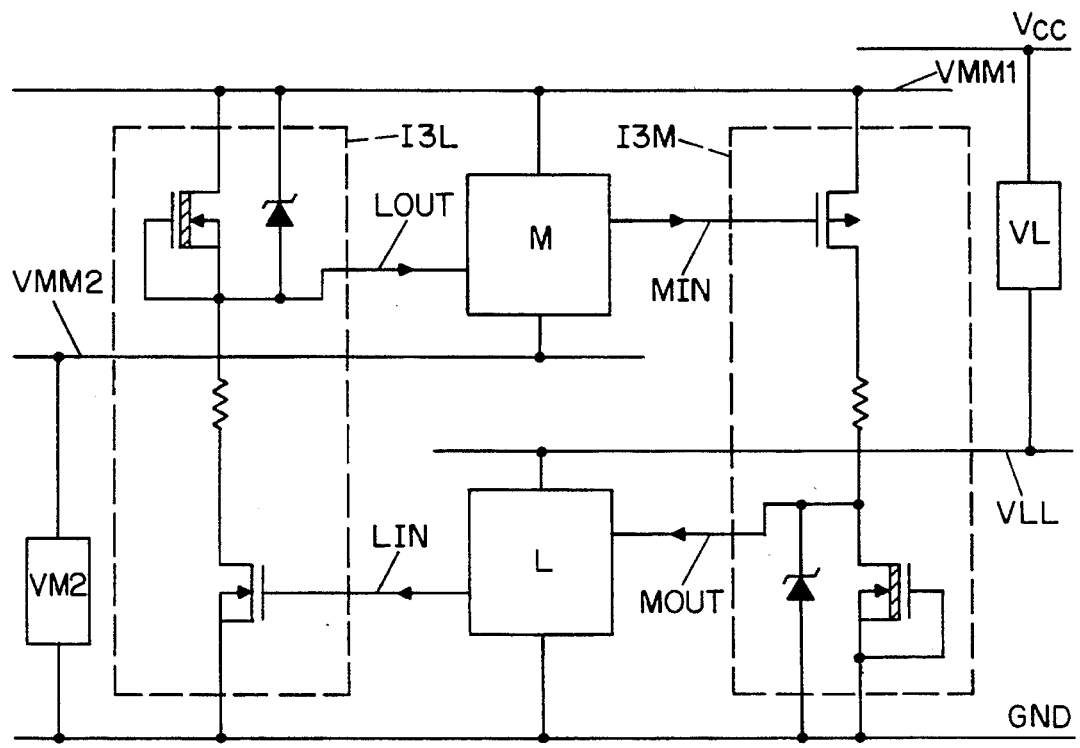
FIG. 7 is a circuit diagram of an interface circuit between the intermediate-potential circuit and the low-potential circuit of a high-withstand voltage IC in accordance with a preferred further embodiment of the invention.

FIG. 6 shows an interface circuit I2 between the high-potential circuit H and the intermediate-potential circuit M, comprising two mediating circuits I2L and I2H. FIG. 7 shows the interface circuit I3 between the intermediate-potential circuit M and the low-potential circuit L, comprising two mediating circuits I3L and I3H. With respect to configuration and operation, the circuits I2 and I3 are like I1.

Figure 3A:
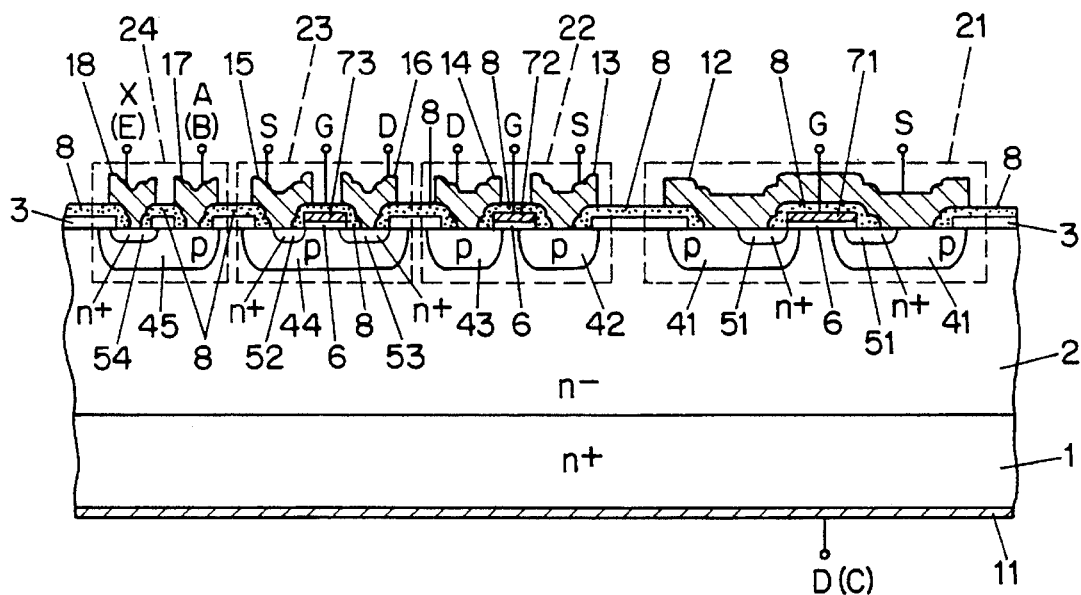
FIG. 3(a) and 3(b) are cross-section drawings, representing portions of chip structure in a conventional high-withstand-voltage IC.
Figure 3B:
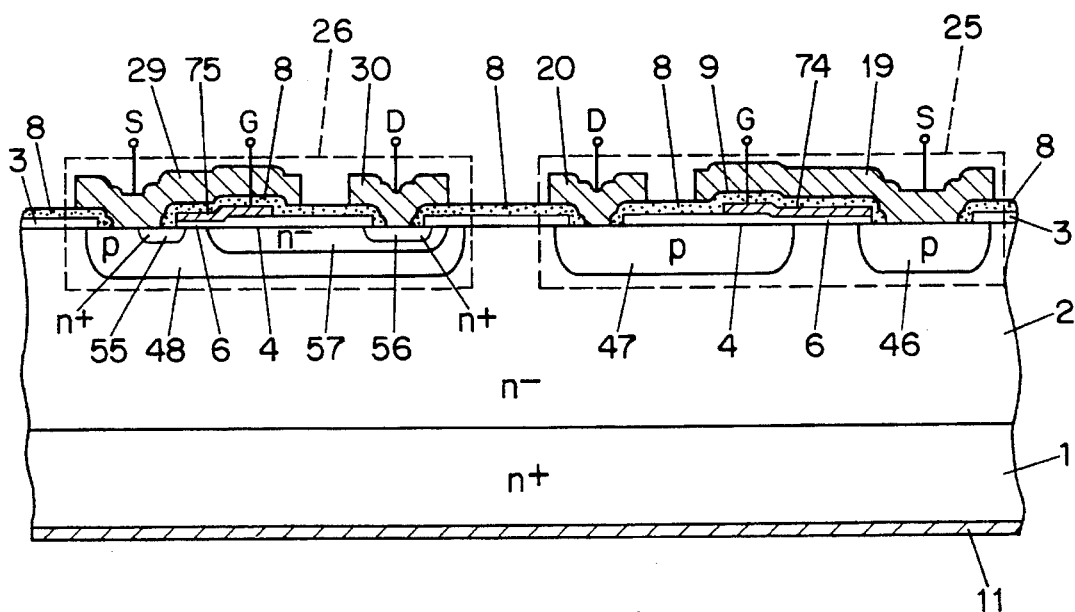
Figure 8:
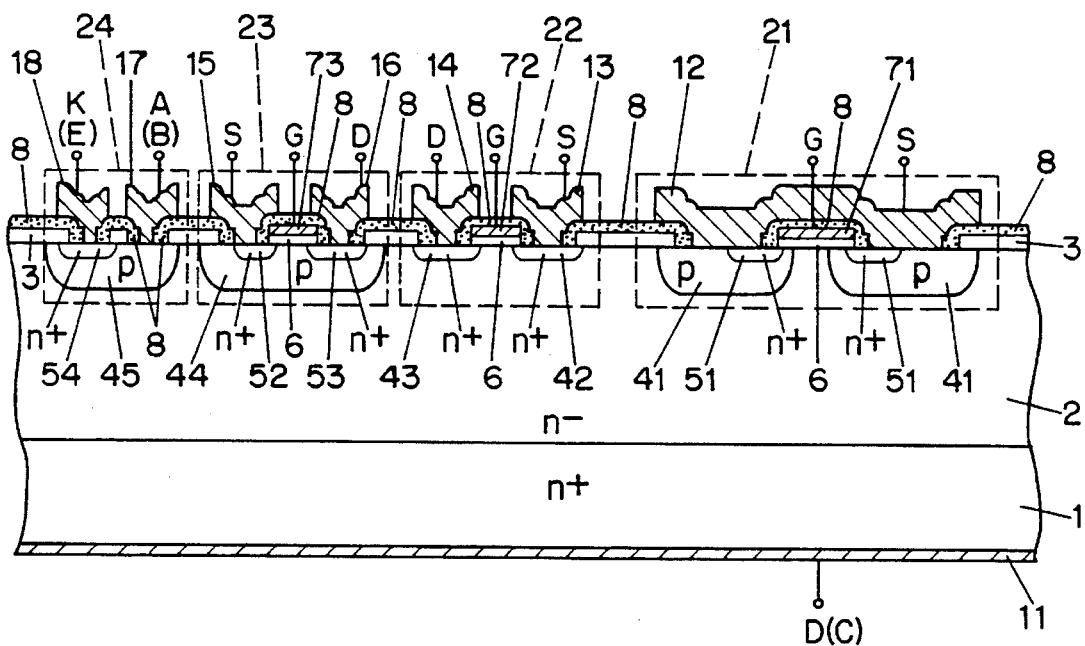
FIG. 8 is a cross-section drawing of chip structure in a preferred embodiment of the invention.

In FIG. 8, parts having counterparts in FIG. 3(a) are designated the same. Since the logic circuit, which conventionally has been integrated in the low-potential circuit, now can be moved to the high-potential circuit, the low-withstand voltage p-channel MOSFET 22 does not require a high withstand voltage toward the n– layer 2. As a result, the source layer 42 and the drain layer 43 can be formed in a p-type diffusion layer that is more shallow than in FIG. 3, whereby the size of the p-channel MOSFET 22 is reduced and its integration density enhanced.

Instead of a MOSFET, an IGBT can be used for the output stage, in which case a p+substrate is used in place of an n+ substrate.

Among benefits of the invention, fewer high-withstand-voltage MOSFETs and less semiconductor area are required, more shallow diffusion layers in p-channel MOSFETs can be used, and enhanced comparator accuracy is realized in a low-cost, high-withstand-voltage IC having high surge tolerance and stability.

We claim:

1. A high-withstand-voltage integrated circuit for driving a power semiconductor device comprising:

a first main power-source terminal for providing a high main power-source potential;

a second main power-source terminal for providing a low main power-source potential;

a plurality of power sources for providing different potentials between the high and low main power-source potentials, comprising a low-potential power source and a high-potential power source;

respective-potential circuits comprising a low-potential circuit connected to the low-potential power source and said low main power-source potential and a high-potential circuit connected to the high-potential power source and said high main power-source potential, each respective-potential circuit having a respective high-potential side and a respective low-potential side with potential of the high-potential side of the high-potential circuit being higher than potential of the high-potential of the low-potential circuit and with potential of the low-potential side of the high-potential circuit being higher than potential of the low potential side of the low-potential circuit; and a first interface-circuit means connected between the low-potential circuit and the high-potential circuit for transmitting signals between the low-potential circuit and the high potential circuit.

2. The high-withstand-voltage integrated circuit of claim 1, wherein the low-potential power source comprises a first constant-voltage element and a first load element connected in series between the first and second main power-source terminals, and a first transistor element having first and second main electrodes and a control electrode, the control electrode being connected at the node where the first constant voltage and the first load element are connected, the first load element being connected to a high-potential side of the first constant-voltage element, and the first transistor element being connected to the first main power-source terminal with the first main electrode, and providing a low-potential power between the second main electrode and the first main power-source terminal.

3. The high-withstand-voltage integrated circuit of claim 1, wherein the high-potential power source comprises a second constant voltage element and a second load element connected in series between the first and second main power-source terminals, and a second transistor element having first and second main electrodes and a control electrode, the control electrode being connected at the node where the second constant voltage element and the second load element are connected, the second load element being connected to a low-potential side of the second constant-voltage element, and the second transistor element being connected to the second main power-source terminal with the first main electrode, and providing a high-potential power between the second main electrode and the first main power-source terminal.

4. The high-withstand-voltage integrated circuit of claim 1, wherein the first interface-circuit means comprises at least one of first and second transmitting circuits between the first and second main power-source terminals, the first transmitting circuit being for transmitting signals from the high-potential circuit to the low-potential circuit, and the second transmitting circuit being from transmitting signals from the low-potential circuit to the high-potential circuit.

5. The high withstand-voltage integrated circuit of claim 4, wherein the first transmitting circuit comprises a series connection of a third transistor element, a first current-limiting element and a first parallel circuit, a control electrode of the third transistor element for receiving a first signal from the high-potential circuit, and said first parallel circuit comprising a third load element and a third constant-voltage element having a low-potential side which is connected to the second main power source terminal, and a high-potential side for outputting a second signal to the low-potential circuit, and the second transmitting circuit comprises a series connection of a fourth transistor element, a second current-limiting element and a second parallel circuit, a control electrode of the fourth transistor element for receiving a third signal from the low-potential circuit, and the second parallel circuit comprising a fourth load element and a fourth constant-voltage element having a high-potential side which is connected to the first main power-source terminal, and a low-potential side for outputting a fourth signal to the high-potential circuit.

6. The high-withstand-voltage integrated circuit of claim 1, wherein the plurality of power sources comprises an intermediate-potential power source, and the respective-potential circuit comprises an intermediate-potential circuit connected to the intermediate-potential power source; and further comprising second and/or third interface circuit means connected between the intermediate-potential circuit and the high-potential circuit, and/or between the intermediate-potential circuit and the low-potential circuit.

7. The high-withstand-voltage integrated circuit of claim 6, wherein the intermediate-potential power source comprises a fifth constant-voltage element connected in series between a third parallel circuit and a fourth parallel circuit with a high-potential side connected to the third parallel circuit, said third parallel circuit comprising a fifth load element and a fifth transistor element, the fifth load element being connected to the first main power-source terminal, the fifth transistor element being connected to the first main power-source terminal with one main electrode, and being connected to the high-potential side of the fifth constant-voltage element with a control electrode, said fourth parallel circuit comprising a sixth load element and a sixth transistor element, the sixth load element being connected to the second main power-source terminal, the sixth transistor element being connected to the second main power-source terminal with one main electrode, and being connected to the low-potential side of the fifth constant-voltage element with a control electrode, and the fifth and sixth transistor elements providing an intermediate-potential power between respective the other main terminals.

8. The high-withstand-voltage integrated circuit of claim 6, wherein the second interface circuit means comprises at least one of third and fourth transmitting circuits, the third transmitting circuit being for transmitting signals from the intermediate-potential circuit to the low-potential circuit and the fourth transmitting circuit being for transmitting signals from the low-potential circuit to the intermediate-potential circuit.

9. The high-withstand-voltage integrated circuit of claim 8, wherein the third transmitting circuit comprises a series connection of a seventh transistor element, a third current-limiting element and a fifth parallel circuit, a control electrode of the seventh transistor element for receiving a first signal from the intermediate-potential circuit, and said fifth parallel circuit comprising a seventh load element and a sixth constant-voltage element having a low-potential side which is connected to the second main power-source terminal, and a high-potential side for outputting a second signal to the low-potential circuit, the fourth transmitting circuit comprising a series connection of an eighth transistor element, a fourth current-limiting element and a sixth parallel circuit, a control electrode of the eight transistor element for receiving a third signal from the low-potential circuit, and the sixth parallel circuit comprising an eighth load element and a seventh constant-voltage element having a high-potential side which is connected to a high potential side of the intermediate-potential power-source, and a low-potential side for outputting a signal to the intermediate-potential circuit.

10. The high-withstand-voltage integrated circuit of claim 6, wherein the third interface circuit means comprises at least one of fifth and sixth transmitting circuits, the fifth transmitting circuit being for transmitting signals from the intermediate-potential circuit to the high-potential circuit and the sixth transmitting circuit being for transmitting signals from the high-potential circuit to the intermediate-potential circuit.

11. The high-withstand-voltage integrated circuit of claim 10, wherein the fifth transmitting circuit comprises a series connection of a ninth transistor element, a fifth current-limiting element and a seventh parallel circuit, a control electrode of the ninth transistor element for receiving a first signal from the intermediate-potential circuit, and the seventh parallel circuit comprising a ninth load element and an eighth constant-voltage element having a high-potential side which is connected to the first main power-source terminal, and a low-potential side for outputting a second signal to the high-potential circuit, and the sixth transmitting circuit comprises a series connection of a tenth transistor element, a sixth current-limiting element and an eighth parallel circuit, a control electrode of the tenth transistor element for receiving a third signal from the high-potential circuit, and said eighth parallel circuit comprising a tenth load element and a ninth constant-voltage element having a low-potential side which is connected to a low-potential side of the intermediate-potential power-source, and a high-potential side for outputting a fourth signal to the intermediate-potential circuit.

12. The high-withstand-voltage integrated circuit of claim 7, wherein the power semiconductor device comprises first and second main device terminals and a control electrode, said control electrode connected to the intermediate potential circuit, said first main device terminal connected to the first main power source terminal, said second main device terminal coupled to said second main power source terminal, and wherein the high-potential side of the fifth constant-voltage element, the fifth load element and the control electrode of the fifth transistor element are commonly connected via a rectifier element to the second main device terminal.

13. The high-withstand-voltage integrated circuit of claim 7, wherein the power semiconductor device comprises first and second main device terminals and a control electrode, said control electrode connected to the intermediate potential circuit, said first main device terminal connected to the first main power source terminal, said second main device terminal coupled to said second main power source terminal, and wherein the low-potential side of the fifth constant voltage element, the sixth load element and the control electrode of the sixth transistor element are commonly connected via a rectifier element to the second main device terminal.

* * * * *